United States Patent [19]

Cuthbert et al.

[11] Patent Number: 4,510,176
[45] Date of Patent: Apr. 9, 1985

[54] REMOVAL OF COATING FROM PERIPHERY OF A SEMICONDUCTOR WAFER

[75] Inventors: John D. Cuthbert, Bethlehem; Nicholas A. Soos, Lower Macungie Township, Lehigh County, both of Pa.

[73] Assignee: AT&T Bell Laboratories, Murray Hill, N.J.

[21] Appl. No.: 535,916

[22] Filed: Sep. 26, 1983

[51] Int. Cl.³ .................. B05D 5/12; B05C 11/12
[52] U.S. Cl. .................. 427/82; 427/240; 427/273; 118/52; 134/33
[58] Field of Search .................. 427/240, 273, 82; 118/52; 430/271; 134/33

[56] References Cited

U.S. PATENT DOCUMENTS 4,113,492  9/1978  Sato et al. .................. 96/67
4,393,807  7/1983  Fujimura et al. .................. 427/240

FOREIGN PATENT DOCUMENTS 17813  2/1977  Japan .................. 118/52

Primary Examiner—John E. Kittle
Assistant Examiner—James J. Seidleck
Attorney, Agent, or Firm—Peter V. D. Wilde

[57] ABSTRACT

The specification describes techniques for removing the edge bead region from a coated semiconductor wafer by directing a jet of solvent at the wafer periphery while the wafer is spinning. The flow patterns of debris resulting from this removal are controlled to prevent contamination of the chip sites on the wafer.

2 Claims, 7 Drawing Figures

REMOVAL OF COATING FROM PERIPHERY OF A SEMICONDUCTOR WAFER

FIELD OF THE INVENTION

The invention involves methods and apparatus for processing semiconductor wafers.

BACKGROUND OF THE INVENTION

Coating materials, e.g. photoresists, are typically applied to a semiconductor wafer by flowing a coating liquid onto the wafer while spinning the wafer. A centrifugal flow component is imparted to the liquid causing it to spread evenly over the wafer surface. Excess material is ejected from the wafer periphery. The objective is to obtain a uniform coating over the entire surface.

These coating processes often result in an edge bead that develops around the periphery of the wafer due to the meniscus that characteristically forms in the liquid at the edge of the wafer. Wafer fabrication problems introduced by this edge bead are described in our earlier patent application Ser. No. 232,739, now abandoned. Techniques for removing edge beads are described in this earlier application and also in U.S. Pat. No. 4,113,492 issued Sept. 12, 1978 to Sato and Fuji.

VLSI circuits can only be successful if the total defect density at all manufacturing steps is held under strict control. Manufacturing experience with the edge bead removal techniques just referenced was unsatisfactory in this respect, even though the induced defect density was very low. The configurations described by Sato and Fuji are not even remotely satisfactory in this respect.

STATEMENT OF THE INVENTION

We have discovered that although the thickness nonuniformity creates problems as described in the prior art, elimination or control of the excess thickness at the edge of the wafer is not an adequate solution. We have gained the understanding that the presence of coating material at the edge of the wafer is per se harmful even if the thickness of this material can be made uniform with the rest of the coating. The harm is due to chipping and flaking of the coating at the edge during handling of the wafers as they are processed. The flakes effectively mask the wafer surface during such steps as reactive ion etching and ion implantation, thereby producing local defects. They also contaminate the ultra-clean processing environment. Terminating the coating at a distance, preferably a minimum distance, from the wafer edge eliminates this problem.

We have also discovered that the techniques described in the prior art for removing edge beads, while adequate for removing the coating material at the edge of the wafer, actually introduce an unacceptably large number of defects in the wafer. We have found that these defects are due to transport of solvent droplets and debris from the edge of the wafer to the chip sites in the interior portions of the wafer during the edge bead removal operation. We have developed a process wherein the material removal operation of the prior art is improved by means or techniques for preventing deposition of debris on the wafer. The technique is to create a positive flow of gas in a radial direction with respect to the wafer and also to block the natural pattern of air flow that would otherwise circulate up and radially inward toward the center of the wafer. While there is a radial component of air flow that is caused by the spinning wafer we have found this alone to be totally inadequate to prevent particulates from the edge-material-removal operation from migrating back to the chip sites. The technique described here involves changing the inherent gas flow dynamics to achieve positive inhibition of the circulation pattern that causes harmful particulates (usually products of the removal process) to deposit on critical chip sites. One exemplary means for achieving this is a cylindrical baffle extending around the periphery of the wafer, inward of the edge, and separated from the wafer by a distance designed to cause a positive gas pressure to build up over the chip sites causing a gas flow pattern that prevents particulates from entering the region of the wafer above the chip sites.

DETAILED DESCRIPTION OF THE INVENTION

Before describing the inventive modification it is useful by way of background to describe the basic edge material removal process to enable one skilled in the art to practice the inventive modification.

Figure 1:
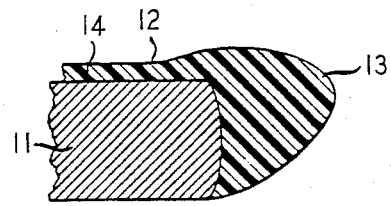
FIG. 1 shows in cross-section an edge portion of a semiconductor wafer having a coating which was previously spun onto the wafer.

FIG. 1 shows an edge portion of a semiconductor wafer 11 having a coating 12 which was spun onto the wafer. Edge bead region 13 forms as a result of the spin application process. The coating is thicker in edge bead region 13 than in interior region 14 where the coating has a substantially uniform thickness. Illustratively, coating 12 can be photoresist. However, the inventive, peripheral coating removal technique is applicable to any soluble coating.

Figure 2:
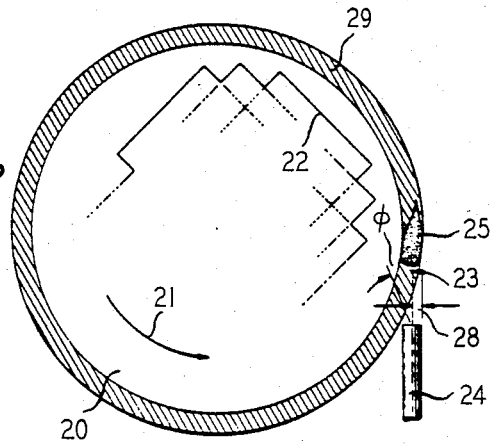
FIG. 2 illustrates in plan the direction of a jet of solvent onto the periphery of a semiconductor wafer in order to remove the peripheral coating, in accordance with an illustrative embodiment of the invention.

In the present invention, a jet of solvent is directed at the periphery of a coated semiconductor wafer to selectively remove the peripheral edge bead region. Turning to FIG. 2, which shows an illustrative application of the inventive method, semiconductor wafer 20 is circular in shape and is spinning in the direction of arrow 21. Typically, the wafer has a diameter on the order of 50 mm to 125 mm and a thickness on the order of 20 mils. Pattern 22 schematically illustrates the outline of the chip array which will subsequently be formed on the wafer. Nozzle 24 is used to direct a jet of solvent 23 onto the wafer periphery. The jet of solvent is applied a distance 28 inward from the edge of the wafer. Plume 25 indicates the flow pattern of the solvent on the wafer surface and annular region 29 is the substantially coating free region on the wafer which results from the application of the jet of solvent.

Illustratively, as shown in FIG. 2, the jet of solvent can be aimed at the wafer periphery in a direction substantially the same as the direction of motion of the wafer. It should be noted, however, that other orientations of the jet of solvent with respect to the wafer motion, such as directing the jet opposite to the direction of motion of the wafer, can lead to satisfactory peripheral coating removal and are within the intended scope of the invention.

In addition, if the wafer rotates too slowly with respect to the jet of solvent incomplete peripheral coating removal occurs. If the wafer rotates too fast with respect to the jet of solvent, the solvent spatters onto the interior portions of the wafer surface. Illustratively, for a silicon wafer having a diameter of about 100 mm and spinning at a rate in the range of 2000 to 3000 rpm, the velocity of the wafer periphery can exceed the velocity of the jet of solvent by a factor in the approximate range of about 3:1 to about 5:1. Under these conditions, there is minimal splashing of the solvent on the wafer surface and the flow pattern of solvent on the wafer results in substantially complete removal of the peripheral coating including that around the wafer bevel. Advantageously, with appropriate changes in spin speed, this technique is applicable to wafers of any diameter.

The width of the coating-free peripheral region (29 of FIG. 2) can be altered by changing the distance (28 of FIG. 2) from the edge of wafer at which the jet is applied or by changing the direction of the jet with respect to the direction of motion of the wafer. This change in direction is indicated in FIG. 2 by the angle $\Phi$ which, illustratively, does not exceed approximately 15 degrees. If the jet of solvent is directed too sharply towards the edge of the wafer, the efficiency of removal of the edge coating is reduced. If the jet of solvent is directed too sharply towards the interior of the wafer, the solvent may tend to splash into the interior of the wafer and have a deleterious effect on interior portions of the coating.

Figure 3:
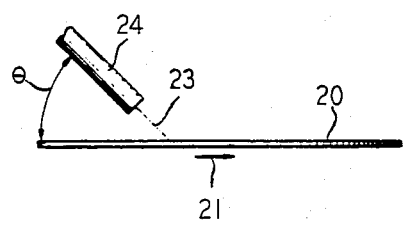
FIG. 3 shows a side view of the process of FIG. 2.

An alternate view of the application of the jet of solvent to the coated semiconductor wafer is shown in FIG. 3. Common elements in FIGS. 2 and 3 have the same identifying numerals. Wafer 20 is again shown spinning in the direction of arrow 21 and nozzle 24 is used to direct a jet of solvent 23 onto the wafer periphery. Advantageously, the nozzle forms an angle $\theta$ with the plane of the wafer in the approximate range of 35 degrees to 45 degrees. However this does not exclude the use of angles down to 0 degrees. Typically, the nozzle has an inner diameter of about 0.020 inches and the nozzle orifice is located approximately 0.5 cm above the plane of the wafer. In order to obtain a smooth jet of solvent, the nozzle is machined with a smooth bore and polished surface around the orifice. In addition, a standard bellows (not shown) is included in the system to pull back the solvent in the nozzle at the end of the cycle. This insures a sharp turn on and turn off of the jet and prevents solvent dripping during other process steps.

Figure 4:
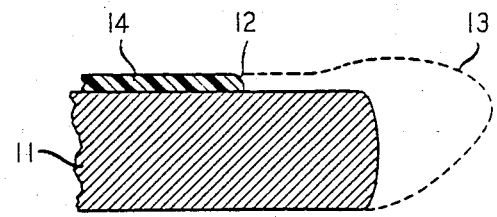
FIG. 4 shows the semiconductor wafer of FIG. 1 after the peripheral coating has been removed, in accordance with an illustrative embodiment of the invention.

FIG. 4 shows the wafer of FIG. 1 after the peripheral coating has been removed in accordance with the principles of the present invention. Common elements in FIGS. 1 and 4 have the same identifying numerals. The portion 13 of coating 12 which has been removed is indicated by the broken curve and the portion 14 of coating 12 which remains is indicated by the solid curve. The boundary between the resist free periphery and the remaining resist is sharp as is indicate in FIG. 4.

One example of the use of the present invention is the removal of peripheral photoresist from a silicon wafer. This example is intended to be illustrative only and numerical parameters stated in connection therewith are not intended to limit the scope of the invention.

Photoresist is generally applied to a silicon wafer, which illustratively has a diameter of about 100 mm, using an automatic spin coater such as the GCA Wafertrac TM. A typical resist apply process involves the application of an adhesion promoter such as HMDS, which is spun to dryness, followed by the application of a standard resist, such as HPR 206, which is spun to final thickness at a high speed in the range of about 2000 rpm to 5000 rpm. Advantageously, the photoresist is spun almost dry before the use of the inventive peripheral coating removal technique.

To use the inventive technique on 100 mm wafers to remove the peripheral photoresist, the wafer is kept spinning after the resist is spun almost dry at a rate in the approximate range of 2000 rpm to 3000 rpm. A jet of solvent, such as AZ thinner, is directed at the periphery of the wafer for about 10 seconds. Approximately 6 cc of this solvent, applied approximately $\frac{1}{8}$ of an inch inward from the edge of the wafer, using the configuration of FIGS. 2 and 3, results in substantially complete removal of the photoresist from the beveled part of the silicon wafer was well as from a region approximately $\frac{1}{8}$ to 3/16 inches back from the edge of the wafer. For a nozzle having an inner diameter of about 0.02 inches and at an applied pressure of about 1.5 pounds per square inch, the jet of solvent has a velocity on the order of about 320 cm/second. After the jet is cut off, the wafer is allowed to spin for approximately 5 to 10 seconds to thoroughly dry.

Turning to the inventive modification of the techniques just described it is helpful to begin with a more detailed treatment of the problem to which the invention is addressed.

Referring to FIG. 2, we describe how it is possible to generate a plume of solvent which removes the resist in the desired manner from the periphery of the wafer. When the plume is generated in the recommended manner, the density of solvent droplets, generated at the edge of the wafer, will be acceptably low, assuming the following idealities: the wafers are perfectly flat; they are perfectly centered on the spin chuck; and the edges of the wafers are smooth and perfectly circular.

None of these idealities are present in practice and all can lead to the generation of small solvent droplets in the vicinity of the plume. Thus, the wafers are flat only to approximately 10 $\mu$m, so that as the wafer is spun, there is a vertical component of velocity at the periphery of the wafer which modulates the plume. The mechanical centering of the wafers on the chuck is only accurate to within approximately $\pm 1/32$ inch and the edges are not entirely smooth. Most important of all, the plume is intercepted once each rotation by the presence of wafer flats, used to identify the material as to type and for orienting the wafers in processing equipment.

Once the mist of droplets form in the vicinity of the plume, the following mechanism is believed operative in causing the droplets to reach the surface of the resist. It is known in the literature (W. G. Cochran, Proceedings of the Cambridge Philosophical Society, Vol. 30 page 365, 1934) that when a disc is spun about its central axis, air currents are set up in a radial direction.

Figure 5:
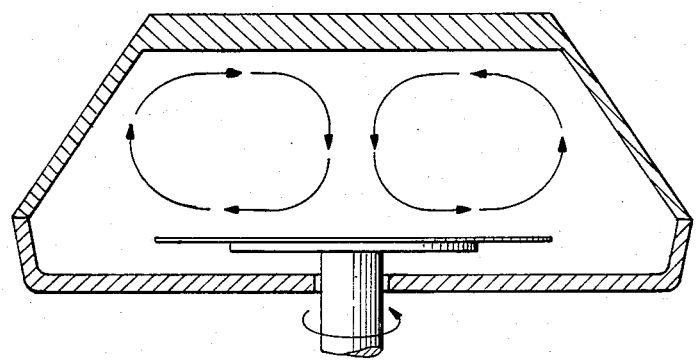
FIG. 5 is a schematic diagram showing the flow pattern of ambient within a typical spin-on coating apparatus.

When such a disc, or wafer, is spun in a confined space, with a shape similar to that of the spin head of a Wafertrac TM resist apply system it is readily understood that the air currents will become closed paths instead of open ones, as shown schematically in FIG. 5.

Clearly any solvent droplets generated at the periphery of a wafer will tend to get caught up in the circular currents of FIG. 5 and can thereby reach the coated surface. Having landed on the photoresist surface, they locally disrupt the thin (approximately 1 $\mu$m) resist film and cause a defect after the photolithographic process. Such defects can be located anywhere within the wafer, but seem to be especially dense near the center.

Practical resist apply systems frequently enclose the wafer as shown in FIG. 5 for safety reasons, in case the wafer breaks while spinning at high speed. It is also helpful to prevent HMDS and resist solvent vapors from leaving the vicinity of the spin head, again for safety reasons. It is also desirable to continuously flush the adhesion promoter and solvent vapors from the spin chamber to obtain a well defined ambient during the resist spin-to-thickness part of the cycle. A deliberate "down draft" is generally provided for this purpose. The air currents in a commercial GCA Wafertrac TM spinner are the superposition of the natural currents caused by the spinning wafer and the externally produced down-draft currents.

The presence of the external down draft helps carry away some of the solvent droplets associated with the prior art technique, but does not eliminate the problem. Arbitrarily large increases in the down draft are not possible because the down-draft has a powerful influence on the drying rate and hence the film thickness characteristics, and must be carefully controlled.

Figure 6:
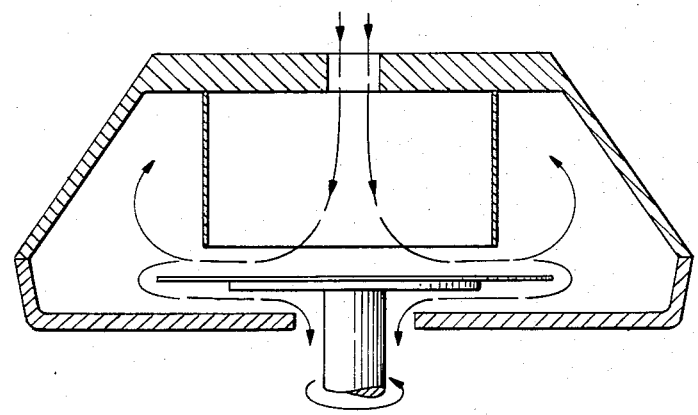
FIG. 6 is a schematic view of the flow pattern produced using the technique of the invention.

The solution to the problem is to break the closed circulation loops in a manner which will still yield satisfactory film thickness characteristics. This has been achieved by the introduction of a simple baffle into the spin chamber, as shown in FIG. 6. The baffle interrupts the circular air flow patterns which are responsible for the defects formed during the portion of the cycle that the peripheral photoresist removal technique is on, while allowing the externally imposed down-draft and natural currents to combine to form an ideal flow contour for the earlier portion of the cycle during which the resist is being spun to proper thickness.

Figure 7:
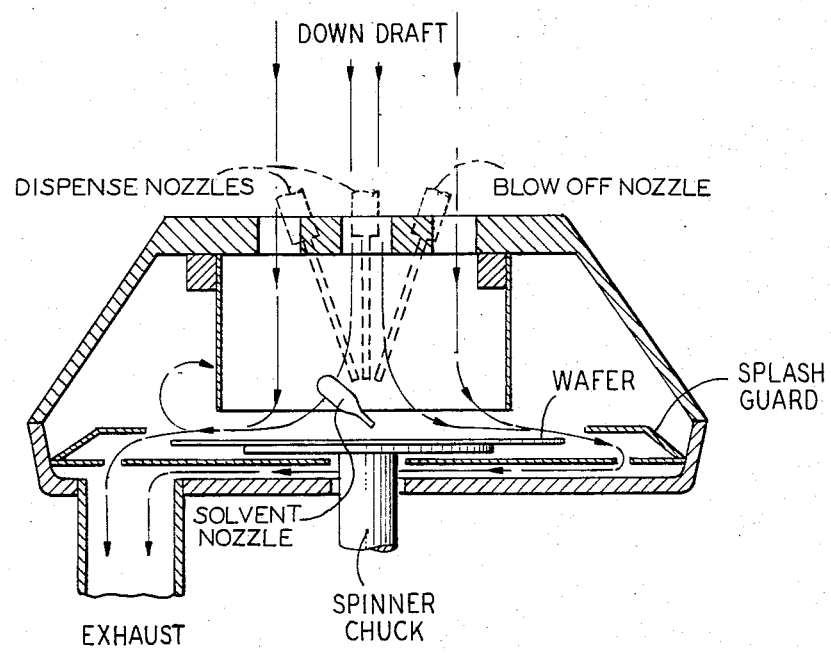
FIG. 7 is a schematic view of a spin-on coating apparatus designed in accordance with the principles of the invention.

A diagram of the complete system is shown in FIG. 7. It has been found that the diameter of the baffle and its height above the wafer can be optimized. The optimum baffle diameter which has given the best protection and which is compatible with the spinner head geometry was found to be 3 inches outside diameter. The wall thickness was between 0.30 to 0.60 inches. This baffle diameter works well on both 100 mm and 125 mm diameter wafers. The corresponding optimum gap is 0.275 $\pm$0.025 inch. If the gap is greater than 0.30 inch the baffle loses its effectiveness in controlling the droplet induced defect density. A gap smaller than 0.25 inch causes the air velocity under the ring to increase to a point that the resist dries too fast there during the initial coating process, and the resist non-uniformity exceeds the permitted value ($\gtrsim 1\%$).

A third, and probably inter-related, variable is the air flow velocity associated with the down draft through the spinner head. This variable is determined by the flow rate through the exhaust tube (see FIG. 7) and has been formed to be optimum between 140 and 170 feet/minute, (assuming the nominal gap and baffle diameter values mentioned above). Flow rates above and below this nominal range will cause symptoms similar to the gap height being too low or too high.

The optimum ranges for the other variables, such as spin speed of the wafer, and velocity of the solvent are given above.

Various additional modifications and extensions of this invention will become apparent to those skilled in the art. All such variations and deviations which basically rely on the teachings through which this invention has advanced the art are properly considered to be within the spirit and scope of this invention.

What is claimed is:

1. Method for the manufacture of semiconductor wafers comprising the steps of:
   spinning the semiconductor wafer,
   applying a coating material to the spinning wafer,
   directing a fluid onto the periphery of the spinning wafer to remove the coating material at the periphery of the wafer, and
   creating a controlled positive flow of gas onto the surface of the wafer while the wafer is spinning, thus causing a centrifugal flow of gas over the surface of the wafer and across the periphery of the wafer and thereby carrying debris of the aforementioned fluid and/or loose material generated at the periphery away from the center of the spinning wafer, and
   establishing a physical barrier separating the positive flow of gas onto the surface of the wafer from the flow of gas that crosses the periphery of the wafer.

2. Apparatus for applying coating material on a wafer comprising:
   support means for supporting the wafer within an enclosure,
   means for spinning the wafer,
   first nozzle means for applying fluid coating material onto the surface of the wafer,
   second nozzle means for directing a flow of fluid selectively onto the peripheral region of the wafer,
   inlet and exhaust means for causing the flow of gas onto the surface of the wafer, and
   an approximately cylindrical baffle arranged concentrically with and above the support means in close proximity thereto.

* * * * *